(12) United States Patent
Moden

(10) Patent No.: US 6,310,390 B1
(45) Date of Patent: *Oct. 30, 2001

(54) BGA PACKAGE AND METHOD OF FABRICATION

(75) Inventor: Walter Moden, Meridian, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/288,423

(22) Filed: Apr. 8, 1999

(51) Int. Cl.[7] .................................................. H01C 23/495
(52) U.S. Cl. .......................... 257/668; 257/676; 257/690; 257/735; 257/772; 257/774; 257/773; 257/779; 257/782; 257/783; 257/784; 257/787
(58) Field of Search ................................... 257/668, 676, 257/690, 735, 772, 774, 773, 779, 782, 783, 784, 787

(56) References Cited

U.S. PATENT DOCUMENTS

| | | | |
|---|---|---|---|
| 5,216,278 | 6/1993 | Lin et al. | 257/688 |
| 5,397,921 | 3/1995 | Karnezos | 257/779 |
| 5,409,865 | 4/1995 | Karnezos | 437/210 |
| 5,420,460 | 5/1995 | Massingill | 257/693 |
| 5,581,226 | * 12/1996 | Shah | 338/42 |
| 5,663,593 | 9/1997 | Mostafazadeh et al. | 257/666 |
| 5,677,566 | 10/1997 | King et al. | 257/666 |
| 5,866,939 | * 2/1999 | Shin et al. | 257/666 |
| 5,898,220 | * 4/1999 | Ball | 257/723 |
| 5,969,416 | * 10/1999 | Kim | 257/692 |
| 5,976,912 | * 11/1999 | Fukutomi et al. | 438/110 |
| 6,064,111 | * 5/2000 | Sota et al. | 257/667 |
| 6,097,087 | 8/2000 | Farnworth et al. . | |
| 6,153,924 | 11/2000 | Kinsman . | |

FOREIGN PATENT DOCUMENTS

406252194-A * 9/1994 (JP) .

OTHER PUBLICATIONS

Amagai, Masazumi. "Chip–Scale Packages for Center–Pad Memory Devices", Chip Scale Review, May 1998, pp. 68–77.

* cited by examiner

Primary Examiner—Minh Loan Tran
Assistant Examiner—Luan Thai
(74) Attorney, Agent, or Firm—Stephen A. Gratton

(57) ABSTRACT

A BGA package and a method for fabricating the package are provided. The package includes a semiconductor die, internal conductors wire bonded to bond pads on the die, external ball contacts attached to ball bonding pads formed on the conductors in a dense grid pattern, and an encapsulating resin encapsulating the die and conductors. The package is fabricated using a lead frame having lead fingers that form the conductors. The die is back bonded to a polymer tape placed across the lead fingers, and then wire bonded to bonding pads on the conductors. In addition, the encapsulating resin is molded to include openings for the ball contacts which are aligned with the ball bonding pads. An alternate embodiment BGA package includes a polymer substrate adhesively bonded to a face of the die. The polymer substrate includes conductors having beam leads aligned with an opening through the polymer substrate. The opening provides access for a bonding tool for bonding bumps on the beam leads to bond pads on the die.

20 Claims, 6 Drawing Sheets

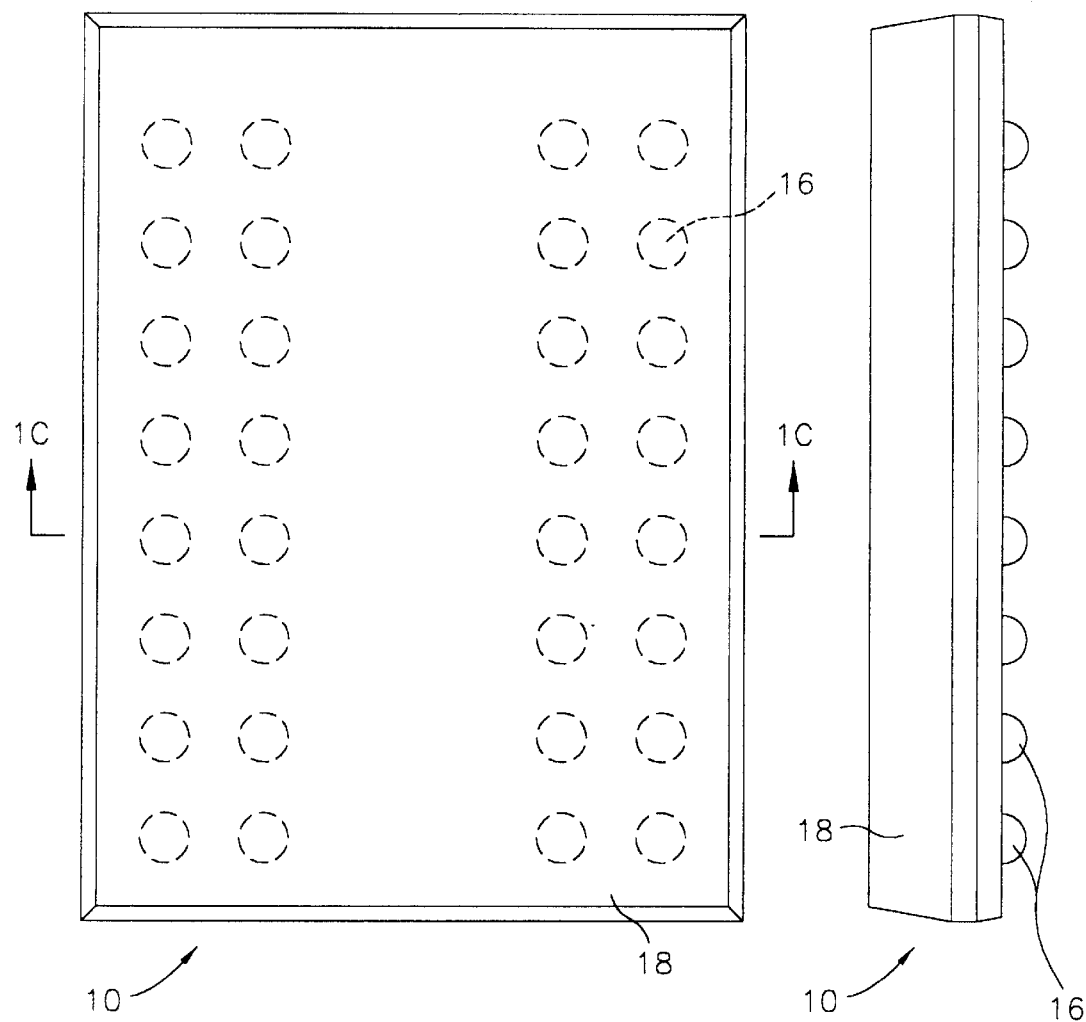
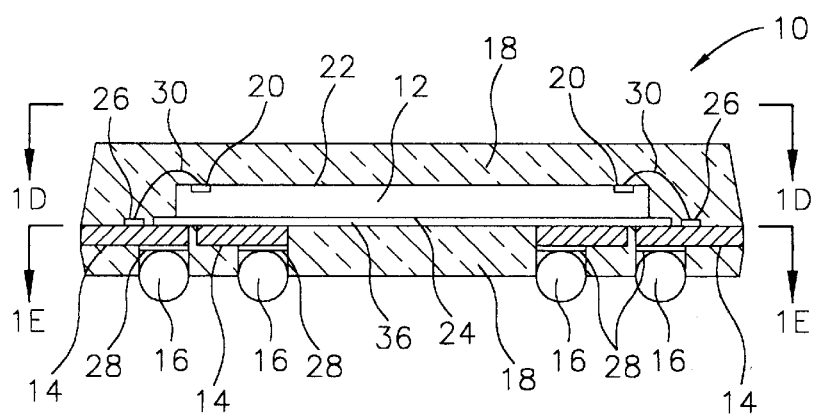
FIGURE 1A     FIGURE 1B
FIGURE 1C

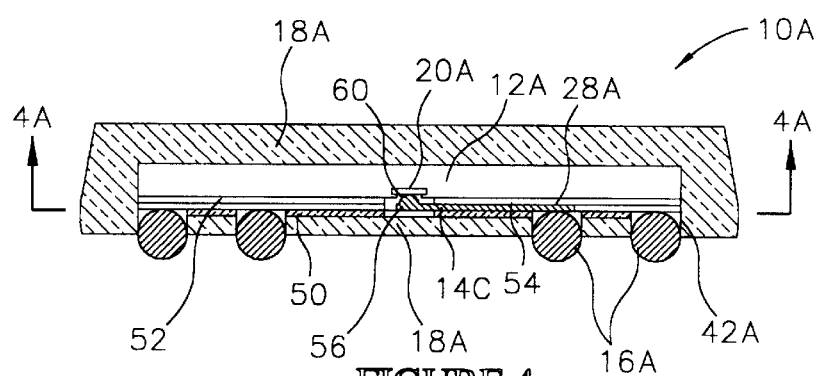
FIGURE 4
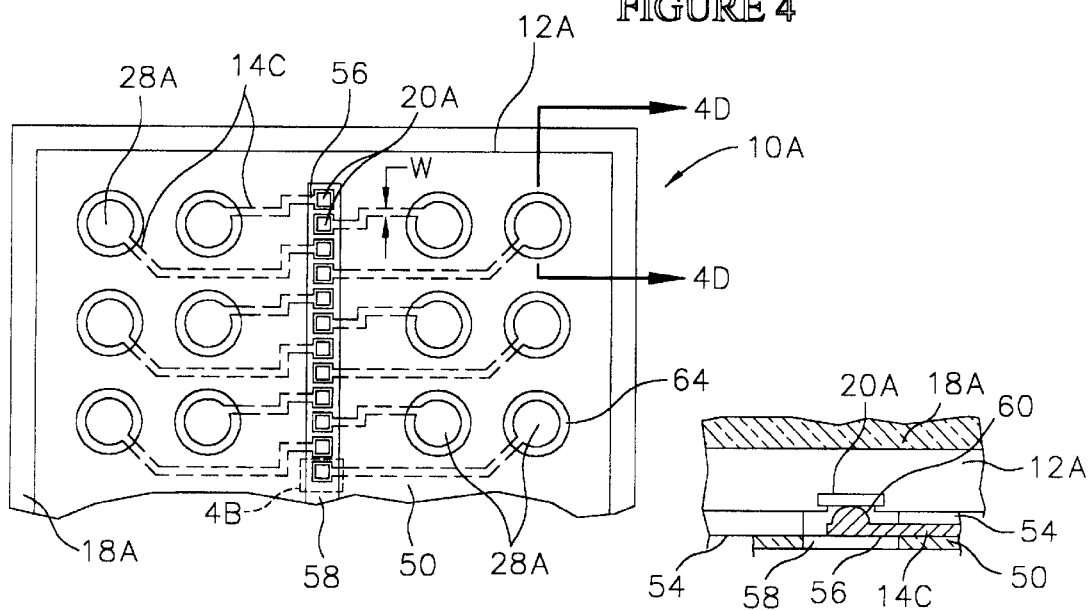
FIGURE 4A
FIGURE 4C
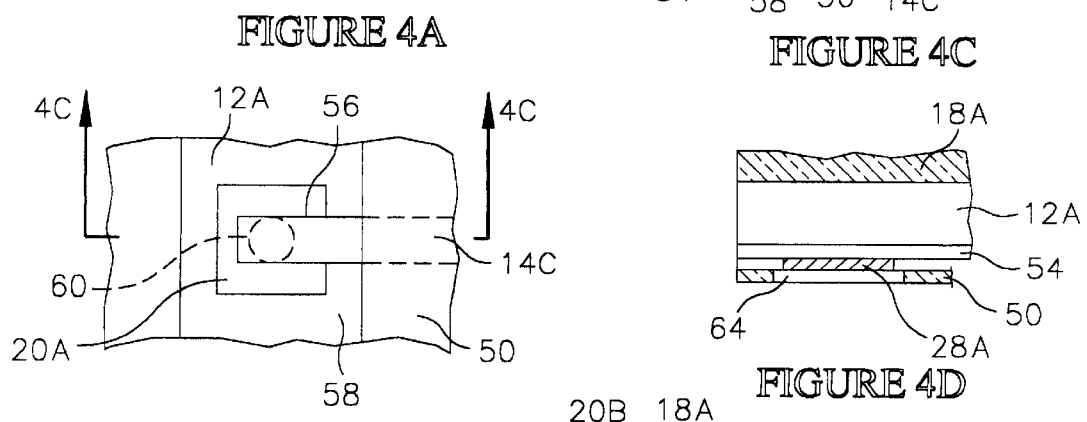
FIGURE 4B
FIGURE 4D
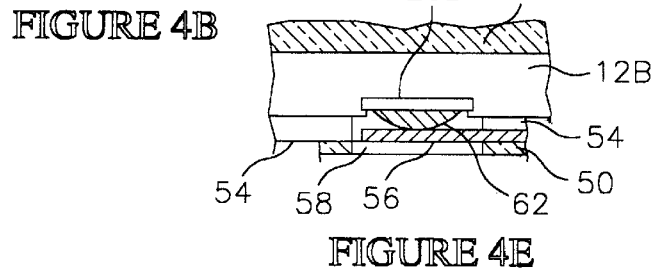
FIGURE 4E

BGA PACKAGE AND METHOD OF FABRICATION

FIELD OF THE INVENTION

This invention relates generally to semiconductor packaging and specifically to an improved BGA package, and to a method for fabricating the BGA package.

BACKGROUND OF THE INVENTION

One type of semiconductor package is referred to as a BGA package. BGA packages were developed to provide a higher lead count, and a smaller foot print, than conventional plastic or ceramic semiconductor packages. A BGA package includes an array of external ball contacts, such as solder balls, that permit the package to be surface mounted to a printed circuit board (PCB) or other electronic component. Some BGA packages have a foot print that is about the size of the die contained in the package. These BGA packages are also known as chip scale packages.

BGA packages typically include a substrate which comprises a reinforced polymer laminate material, such as bismaleimide triazine (BT), or a polyimide resin. Patterns of metal conductors formed on the substrate form the internal signal traces for the package. The conductors can include wire bonding pads for wire bonding bond wires to the die, and ball bonding pads for attaching external ball contacts, such as solder balls. An encapsulating resin, such as a Novoloc based epoxy, can also be molded onto the substrate to encapsulate the die and bond wires.

Fabrication processes for BGA packages differ from the fabrication processes for conventional plastic packages. In particular, for fabricating conventional plastic packages metal lead frames are employed. The lead frames include patterns of lead fingers which form the internal signal traces and external leads of the package. Since equipment and procedures have been developed for packaging dice using metal lead frames, it would be advantageous to adapt metal lead frames to the fabrication of BGA packages.

U.S. Pat. No. 5,677,566 to King et al, discloses a BGA package fabricated using a metal lead frame. This package employs a leads over chip (LOC) lead frame having lead fingers to which the die is wire bonded. The lead fingers include ball bonding pads which are aligned with openings in an encapsulating material. The openings allow ball contacts, such as solder balls, to be bonded to the ball bonding pads on the lead fingers.

The present invention is also directed to a BGA package in which a metal lead frame can be employed to fabricate the package. The lead frame includes lead fingers configured to provide an increased density, or "packing fraction" for the ball contacts. This permits the package to be fabricated with a dense area array of ball contacts. In addition, the lead frame can be configured for packaging different sizes of dice, while at the same time, the size and external configuration of the package and ball contacts can be standardized. In a second embodiment of the invention the lead frame is replaced by a polymer tape and the die is flip chip mounted to beam leads on the tape.

SUMMARY OF THE INVENTION

In accordance with the present invention, an improved BGA package, and a method for fabricating the package are provided. The BGA package, broadly stated, comprises: a semiconductor die; internal conductors in electrical communication with the die; external ball contacts attached to the conductors; and an encapsulating resin encapsulating the die and conductors. The encapsulating resin includes openings for locating and electrically insulating the ball contacts on the conductors. The openings also provide access to the conductors for testing the die prior to attachment of the ball contacts.

In a first embodiment of the BGA package, the conductors are formed by lead fingers of a lead frame. A polymer tape electrically insulates the lead fingers, and supports the die for wire bonding to the lead fingers. The lead fingers include wire bonding pads on a first side thereof, for wire bonding to bond pads on the die. The lead fingers also include ball bonding pads on an opposing second side thereof, for attaching the external ball contacts. The lead fingers and ball bonding pads on the lead fingers are formed in a configuration that permits the ball contacts to be arranged in a dense area array, such as a ball grid array. In addition, bond wires in the package are protected, and the package can be similar in size to a conventional thin small outline package (TSOP) but with a dense array of ball contacts rather than wire leads.

A method for fabricating the first embodiment BGA package comprises the steps of: providing a semiconductor die; providing a lead frame including lead fingers having wire bonding pads and ball bonding pads in a dense area array; placing a polymer tape on the lead fingers; back bonding the die to the polymer tape by forming an adhesive layer therebetween; wire bonding the die to the wire bonding pads; encapsulating the die and lead fingers in an encapsulating resin having openings aligned with the ball bonding pads; and attaching ball contacts to the ball bonding pads. In general each of these steps can be performed using equipment identical or similar to equipment used to fabricate conventional plastic semiconductor packages using lead frames.

In a second embodiment of the BGA package, the die is flip chip mounted to conductors contained on a polymer substrate adhesively bonded to a face of the die. The conductors include beam leads that are bonded to the bond pads on the die, and ball bonding pads for attaching the ball contacts. The polymer substrate includes an elongated opening aligned with the beam leads which provides access for a bonding tool. The polymer substrate also includes openings aligned with the ball bonding pads, which provide access for attaching the ball contacts to the ball bonding pads, and for making electrical connections for testing the die prior to attachment of the ball contacts. As with the first embodiment BGA package, the ball bonding pads are arranged in a dense area array.

A method for fabricating the second embodiment BGA package comprises the steps of: providing a semiconductor die having a face with bond pads thereon; providing a polymer substrate having conductors with beam leads for bonding to the bond pads and ball bonding pads for attaching ball contacts; adhesively bonding the polymer substrate to the face of the die; flip chip bonding the bond pads on the die to the beam leads on the conductors; encapsulating the die and conductors in an encapsulating resin having openings aligned with the ball bonding pads; and attaching the ball contacts to the ball bonding pads.

BRIEF DESCRIPTION OF THE DRAWINGS

FIG. 1A is an enlarged plan view of a BGA package constructed in accordance with the invention;

FIG. 1B is a side elevation view of the BGA package of FIG. 1A;

FIG. 1C is a schematic cross sectional view of the BGA package taken along section line 1C—1C of FIG. 1A;

FIG. 4 is a schematic cross sectional view of an alternate embodiment BGA package;

FIG. 4A is a partial schematic cross sectional view taken along section line 4A—4A of FIG. 4;

FIG. 4B is an enlarged portion of FIG. 4A taken along section line 4B of FIG. 4A;

FIG. 4C is a cross sectional view taken along section line 4C—4C of FIG. 4B;

FIG. 4D is a cross sectional view taken along section line 4D—4D of FIG. 4A;

FIG. 4E is a schematic cross sectional view equivalent to FIG. 4C of an alternate embodiment die bonding method wherein a bumped bond pad on the die is employed.

DETAILED DESCRIPTION OF THE PREFERRED EMBODIMENTS

Figure 1D:
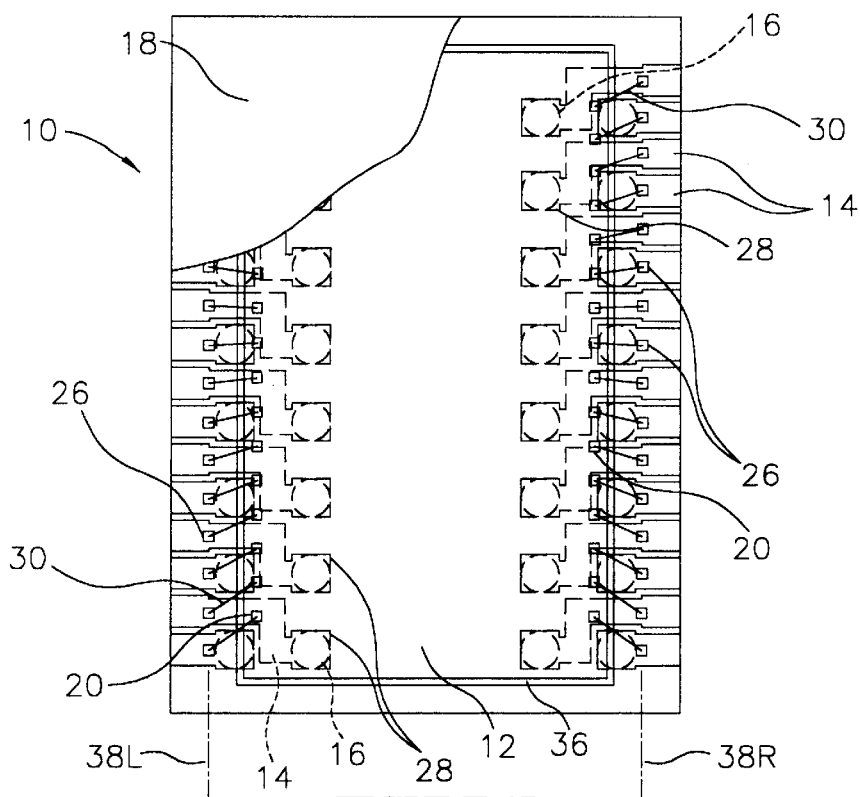
FIG. 1D is a schematic plan view taken along line 1D—1D of FIG. 1A and partially cut away.

Referring to FIGS. 1A–1C, a BGA package 10 constructed in accordance with the invention is illustrated. The BGA package 10 comprises: a semiconductor die 12 (FIG. 1C); internal conductors 14 (FIG. 1C) in electrical communication with the die 12; external ball contacts 16 attached to the conductors 14; and an encapsulating resin 18 encapsulating the die 12 and the conductors 14.

As shown in FIG. 1C, the die 12 includes a face side 22 (i.e., circuit side) and a back side 24. The face side 22 includes a pattern of bond pads 20 in electrical communication with the integrated circuits contained on the die 12. The bond pads 20 are contained in two rows located along opposite edges of the die 12 (i.e., edge connect die).

Figure 3:
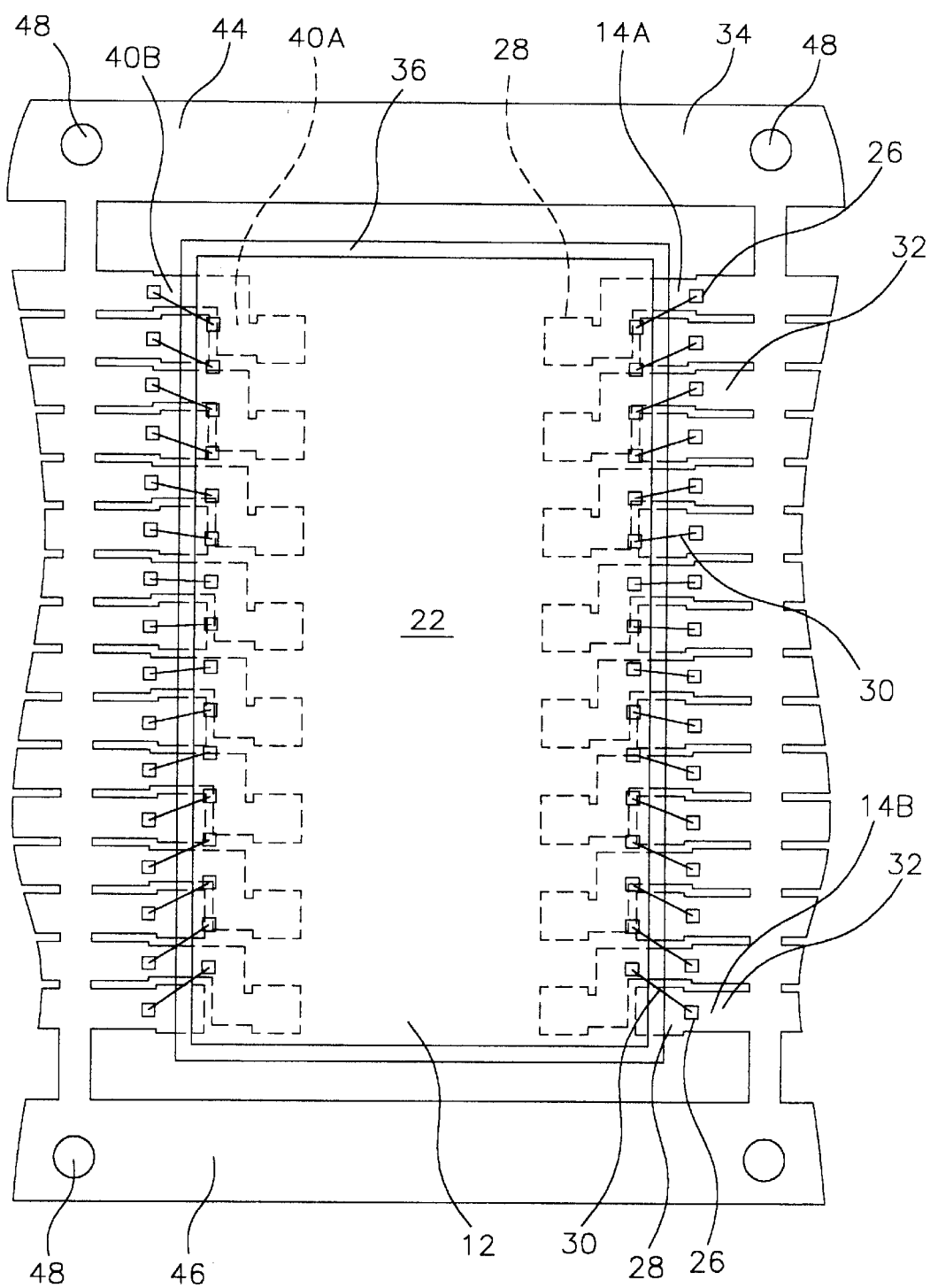
FIG. 3 is an enlarged plan view taken along line 3—3 of FIG. 2D illustrating wire bonding of a die to a lead frame during fabrication of the BGA package of FIGS. 1A–1D.

As also shown in FIG. 1C, the conductors 14 include wire bonding pads 26 and ball bonding pads 28. The wire bonding pads 26 and the ball bonding pads 28 are formed on opposing major surfaces of the conductors 14. The wire bonding pads 26 permit bond wires 30 to be wire bonded to the conductors 14, and to the bond pads 20 on the die 12. The ball bonding pads 28 permit the ball contacts 16 to be attached to the conductors 14. As will be further explained, the conductors 14 initially comprise lead fingers 32 (FIG. 3) of a lead frame 34 (FIG. 3). The wire bonding pads 26 and the ball bonding pads 28 comprise plated portions of the lead fingers 32.

Still referring to FIG. 1C, the BGA package 10 also includes a polymer tape 36 for supporting the die 12 for wire bonding, and for electrically insulating the die 12 from the conductors 14. The polymer tape 36 can comprise a commercially available polyimide tape, such as "KAPTON" tape, manufactured by DuPont. The polymer tape 36 can also include adhesive layers on one or more sides thereof, for adhesively bonding the polymer tape 36 to the back side 24 of the die 12, and to the conductors 14. One suitable adhesive tape used for bonding dice to lead frames is known in the art as "lead lock tape".

Figure 1E:
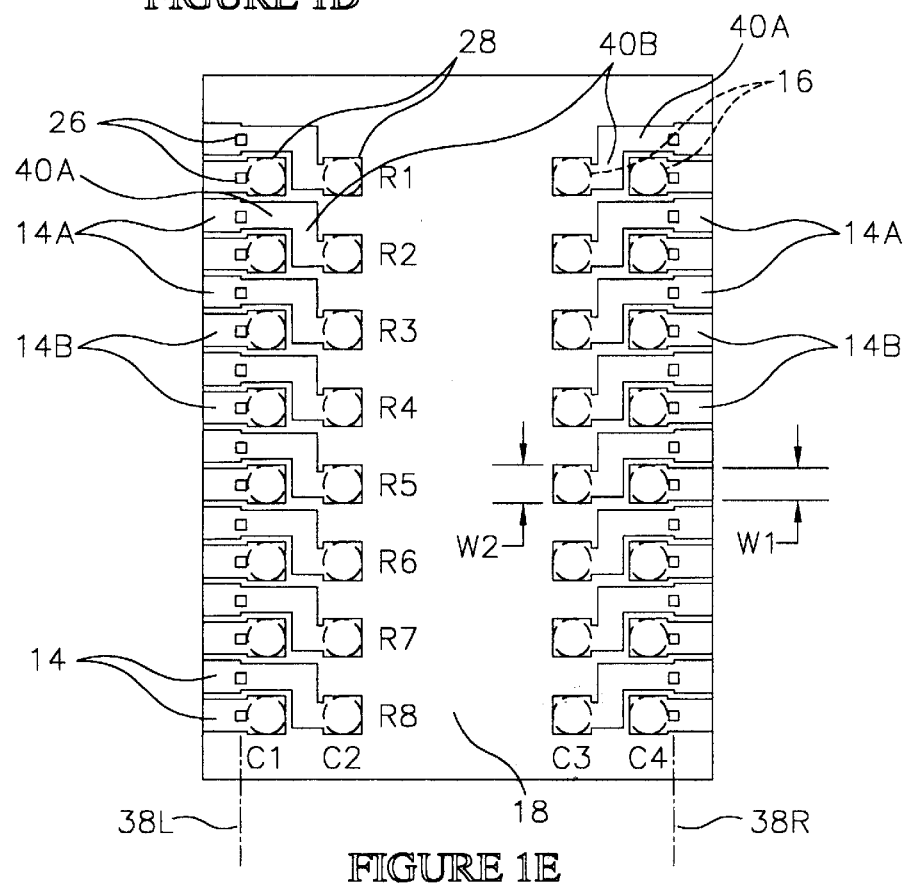
FIG. 1E is a schematic cross sectional taken along section line 1E—1E of FIG. 1A.

Referring to FIGS. 1D and 1E, the layout of the conductors 14 is illustrated. FIG. 1D illustrates the conductors 14 wire bonded to the die 12. FIG. 1E illustrates the conductors 14 separate from the die 12. The conductors 14 are configured such that the wire bonding pads 26 are arranged along common axes 38L, 38R. This facilitates the wire bonding process.

In addition as shown in FIG. 1E, the conductors 14 are configured such that the ball bonding pads 28 are arranged in rows R1–R8 and columns C1–C4. In the illustrative embodiment, every other conductor 14A has a straight line, or substantially linear configuration. In addition, every other conductor 14B has straight line portion 40A that is parallel to the conductors 14A, and a right angle portion 40B that is perpendicular to the conductors 14A. This layout permits the ball contacts 16 to be arranged in a dense grid array. However, as is apparent, other layouts that produce a dense grid array for the ball bonding pads 28 can be employed.

As used herein, the term "dense grid array" refers to a contact pattern in which the density of the ball contacts 16 is high in relation to the total area occupied by the ball contacts 16. This relationship is sometimes expressed as a "packing fraction". In general, the packing fraction of a pattern of contacts is the area occupied by the contacts over the total area available. For example, contacts formed in a grid pattern of one hundred and forty four one inch square blocks in an area twelve inches by twelve inches would yield a packing fraction of one. A pattern of one hundred and forty-four one inch diameter round contacts in a grid of one hundred forty-four one inch squares would yield a packing fraction of 0.7854. In actual practice packing fractions close to one are not possible because some spacing is required between the contacts in order to minimize shorting between adjacent contacts. For example, contacts formed as solder bumps require some spacing to prevent shorting during reflow. In general, a "dense grid array" will have a packing fraction of 0.25 or greater.

In FIGS. 1D and 1E, for simplicity the ball bonding pads 28 on the conductors 14 are arranged in a grid pattern of eight rows (R1–R8) and four columns (C1–C4). However, it is to be understood that a greater number of rows and columns can be employed. In addition, for simplicity a width W1 of the conductors 14 is only slightly smaller that a width W2 of the ball bonding pads 28. However, by making the width W1 of the conductors 14 much smaller than the width W2 of the ball bonding pads 28, more columns and rows can be formed and denser packing fractions achieved. By way of example and not limitation, a representative width W1 can be from about 0.20 mm to 0.25 mm, and a representative width W2 can be from about 0.25 mm to 0.35 mm.

Figure 2A:
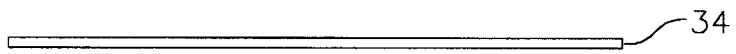
FIGS. 2A–2G are schematic cross sectional views illustrating steps in a method for fabricating the BGA package of FIGS. 1A–1D.

Referring to FIGS. 2A–2G, steps in the method for fabricating the BGA package 10 are illustrated. Initially as shown in FIG. 2A, the lead frame 34 is provided. The lead frame 34 can comprise a nickel-iron alloy (e.g., 42% Nickel-58% Iron), a clad material (e.g., copper clad stainless steel) or a copper alloy. Conventional fabrication processes such as stamping or chemical milling can be used to form the lead frame 34.

As shown in FIG. 3, the lead frame 34 includes parallel spaced side rails 44, 46 with indexing openings 48. The lead frame 34 also includes multiple patterns of lead fingers 32 that will form the internal conductors 14 for the BGA package 10. In the illustrative embodiment, the lead frame 34 and lead fingers 32 have a leads under chip (LUC) configuration. In addition, the lead fingers 32 are configured as previously described such that wire bonding pads 26 are co-linear to one another, and ball bonding pads 28 are formed in a dense grid array. The wire bonding pads 26 can comprise areas plated with a wire bondable metal such as gold or silver. The ball bonding pads 28 can also be plated with a metal, such as copper, or solder flux, that will facilitate a subsequent process for attaching the ball contacts 16.

Figure 2B:
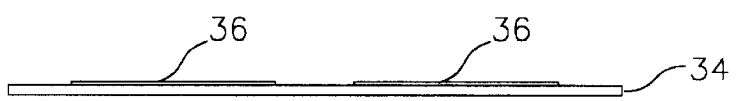

Next, as shown in FIG. 2B, the polymer tape 36 is attached to the lead fingers 32 of the lead frame 34 to provide support for the die 12. As shown in FIG. 3, the polymer tape 36 has a peripheral shape that is slightly larger than that of the die. In addition, the polymer tape 36 spans an open area between the lead fingers 32 in a manner similar to a die mounting paddle on a conventional lead frame. The polymer tape 36 can comprise polyimide or other suitable material having an adhesive formed on one or both major surfaces thereof.

Figure 2C:
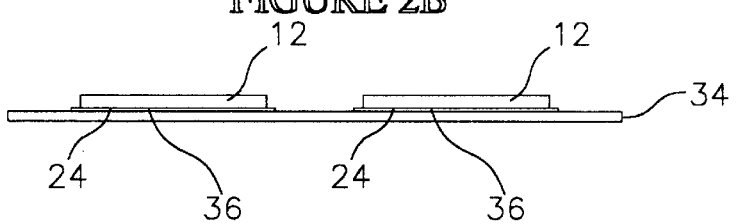

Next, as shown in FIG. 2C, the backside 24 of the die 12 can be adhesively attached to the polymer tape 36. If the polymer tape 36 includes an adhesive surface no further adhesive is required. Alternately, a die attach adhesive, such as a filled epoxy, an unfilled epoxy, an acrylic, or a polyimide material can be employed. A conventional die attacher can be used to adhesively attach the die 12 to the polymer tape 36.

Figure 2D:
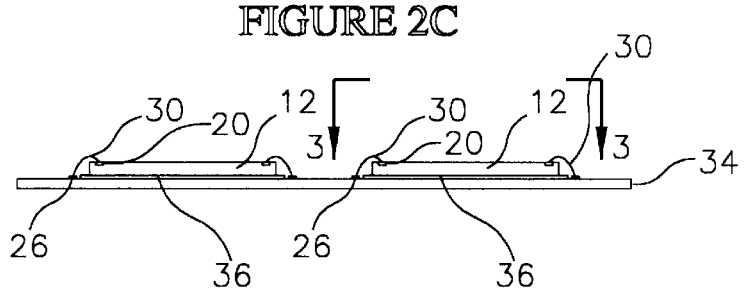

Next, as shown in FIG. 2D, bond wires 30 can be wire bonded to the bond pads 20 on the die 12 and to the wire bonding pads 26 on the lead fingers 32 of the lead frame 34. A conventional wire bonder can be used to wire bond the bond wires 30.

Figure 2E:
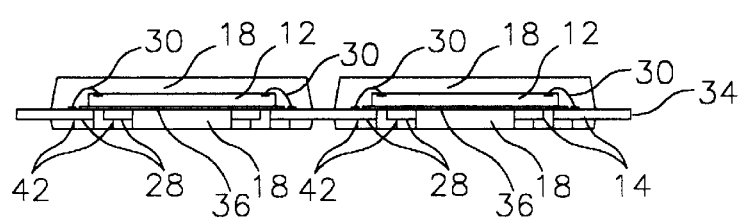

Next, as shown in FIG. 2E, the encapsulating resin 18 can be formed on either side of the die 12. The encapsulating resin 18 can comprise a Novolac based epoxy formed in a desired shape using a transfer molding process, and then cured using an oven. In addition, the encapsulating resin 18 includes openings 42 that align with the ball bonding pads 28 on the lead fingers 32. The openings 42 will subsequently be used to attach the ball contacts 16 to the ball bonding pads 28. In addition, the openings 42 provide access to the conductors 14 for making electrical connections for testing the die 12 prior to attachment of the ball contacts 16. This is an advantage because the ball contacts 16 are susceptible to deformation and separation from the BGA package 10 during testing.

Figure 2F:
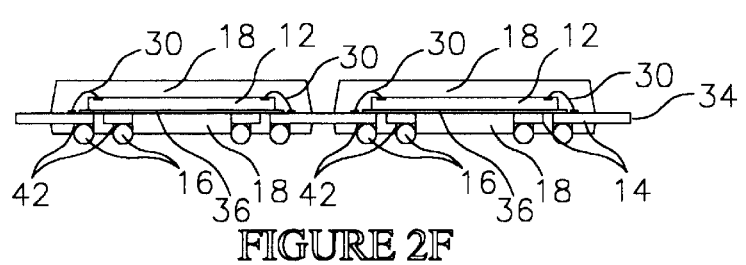

Next, as shown in FIG. 2F, the ball contacts 16 can be attached to the ball bonding pads 28. Preferably the ball contacts 16 comprise solder, such that a solder reflow process can be used to bond the ball contacts 16 to the ball bonding pads 28. Prior to the solder reflow process, solder flux can be deposited on the ball bonding pads 28 and on the ball contacts 16. The ball contacts 16 can then be placed on the ball bonding pads 28, and a furnace used to form metallurgical solder joints between the ball contacts 16 and the ball bonding pads 28. During bonding of the ball contacts 16, the openings 42 in the encapsulating resin 18 facilitate alignment of the ball contacts 16 to the ball bonding pads 28. In addition, in the completed EGA package 10, the encapsulating resin 18 insulates adjacent ball contacts 16.

Figure 2G:
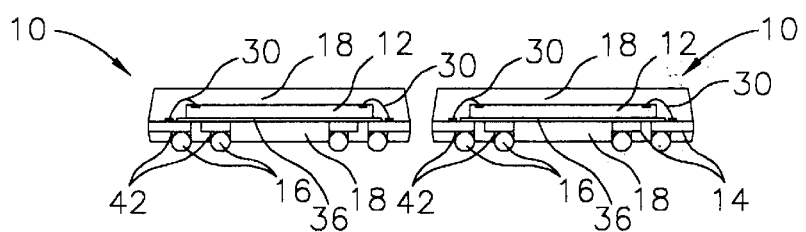

Next, as shown in FIG. 2G, the BGA package 10 can be singulated from the lead frame 34 by shearing, cutting or punching the lead frame 34. The BGA package 10 is characterized by an outline that is thin and small, but with a high input/output capability provided by the dense area array of ball contacts 16. In addition, different sizes and types of dice 12 can be accommodated by the EGA package 10, while the outline of the package and the configuration of the ball contacts 16 can be standardized.

Referring to FIGS. 4–4E, an alternate embodiment BGA package 10A is illustrated. The BGA package 10A includes a semiconductor die 12A, a polymer substrate 50 adhesively bonded to a face 52 of the die 12A; an encapsulating resin 18A encapsulating the die 12A and substrate 50; and a plurality of ball contacts 16A in a dense grid array.

The semiconductor die 12A is adapted for flip chip mounting. The die 12A includes bond pads 20A arranged in a single row along a center line of the die 12A. An adhesive layer 54 adhesively attaches the polymer substrate 50 to the face 52 of the die 12A. The adhesive layer 54 can comprise a silicone, epoxy, polyimide or acrylic material deposited in a required pattern and then cured as required.

The polymer substrate 50 is similar to multi layered TAB tape and includes a pattern of conductors 14C formed thereon. Suitable materials for the polymer substrate 50 include polyimide, polyester, epoxy, urethane, polystyrene, silicone and polycarbonate. A representative thickness for the polymer substrate 50 can be from about 25 to 125 $\mu$m.

Preferably, the conductors 14C comprise a highly conductive metal, such as copper, plated copper, gold, gold plated metals, nickel, or an alloy such as Ni—Pd. The conductors 14C can be formed on the polymer substrate using a subtractive process, such as etching a plated or clad metal layer, or using an additive process, such as deposition of a metal through a mask. By way of example, the conductors 14C can be formed with a thickness of from 1 $\mu$m to 75 $\mu$m and a width of from 0.050 mm to 0.1 mm or greater.

As shown in FIG. 4A, the conductors 14C include beam leads 56 on first ends thereof, and ball bonding pads 28A on second ends thereof. The conductors 14C can be configured substantially as previously described for conductors 14 such that the ball bonding pads 28A form a dense grid pattern.

The beam leads 56 are cantilevered over an elongated opening 58 in the polymer substrate 50. As shown in FIG. 4B, the beam leads align with the bond pads 20A on the die 12A. In addition, as shown in FIG. 4C, the beam leads 56 include bumps 60 that are bonded to the bond pads 20A using a bonding tool, such as a thermode or thermocompression tool. The elongated opening 58 in the polymer substrate 50 provides access for the bonding tool.

The bumps 60 preferably comprise gold, such that the bumps 60 will readily bond to bond pads 20A formed of aluminum. Alternately the bumps 60 can comprise a conductive polymer material such as an isotropic or anisotropic adhesive. The bumps 60 can be formed on the beam leads 56 using a bump transfer process wherein the bumps 60 are initially formed on a substrate, and then transferred to the beam leads 56. Alternately, as shown in FIG. 4E, in place of the bumps 60, a bumped semiconductor die 12B having bond pads 20B with solder bumps 62 can be bonded to the beam leads 56.

As shown in FIG. 4D, the polymer substrate 50 also includes openings 64 to the ball bonding pads 28A. In addition, the encapsulating resin 18A includes openings 42A (FIG. 4) that align with the ball bonding pads 28A. The openings 64 and 42A provide access to the ball bonding pads 28A for attaching the ball contacts 16A (FIG. 4). In addition, the openings 64 electrically insulate the ball contacts 16A in the completed package, and can be used to provide electrical access for testing the die 12B prior to attachment of the ball contacts 16A.

Figure 5A:
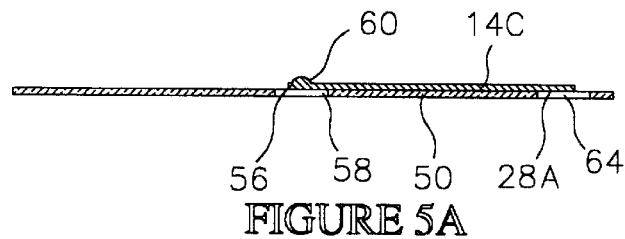
FIG. 5A–5E are schematic cross sectional views illustrating steps in a method for fabricating the BGA package of FIGS. 4–4D.

Referring to FIGS. 5A–5E, steps in the method for fabricating the BGA package 10A are illustrated. Initially, as shown in FIG. 5A, the polymer substrate 50 can be provided. For simplicity, the polymer substrate 50 is shown as being configured to form a single BGA package 10A. However, in actual practice the polymer substrate 50 can comprise a "coupon" of material adapted to form several BGA packages 10A. The coupon can then be singulated, by cutting or punching, into separate packages.

The polymer substrate 50 includes a pattern of conductors 14C formed substantially as previously described. For simplicity only a single conductor 14C is illustrated. The conductor 14C includes the beam lead 56 with the bump 60. In addition the conductor 14C includes the ball bonding pad 28A. The polymer substrate 50 also includes the opening 58 aligned with beam lead 56 and the opening 64 aligned with the ball bonding pad 28A.

Figure 5B:
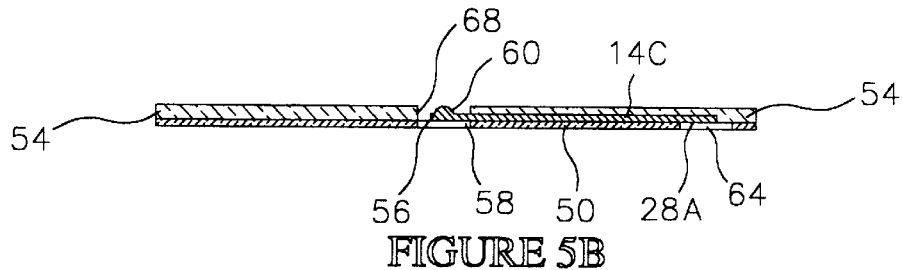

Next, as shown in FIG. 5B, the adhesive layer 54 can be formed on the polymer substrate 50. The adhesive layer 54 substantially covers the conductor 14C, but includes an opening 68 which exposes the bump 60 on the beam lead 56 for bonding.

Figure 5C:
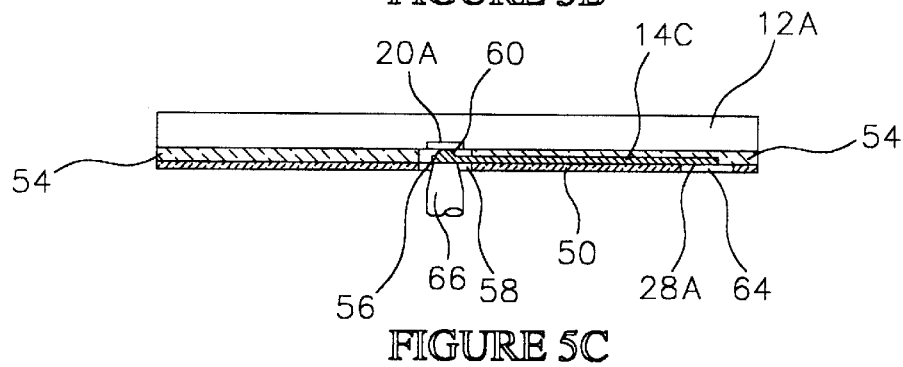

Next, as shown in FIG. 5C, the polymer substrate 50 is adhesively bonded to the die 12A using the adhesive layer 54. The substrate 50 is attached to the die 12A such that the bond pad 20A on the die 12A is aligned with the bump 60 on the beam lead 56. Rather than being formed on the polymer substrate 50, the adhesive layer 54 can be formed on the die 12A leaving the bond pad 20A exposed.

As also shown in FIG. 5C, a bonding tool 66 can be placed through the opening 58 in the polymer substrate 50 to bond the bump 60 to the bond pad 20A. The bonding tool 66 can comprise a conventional thermode or thermocompression tool.

Figure 5D:
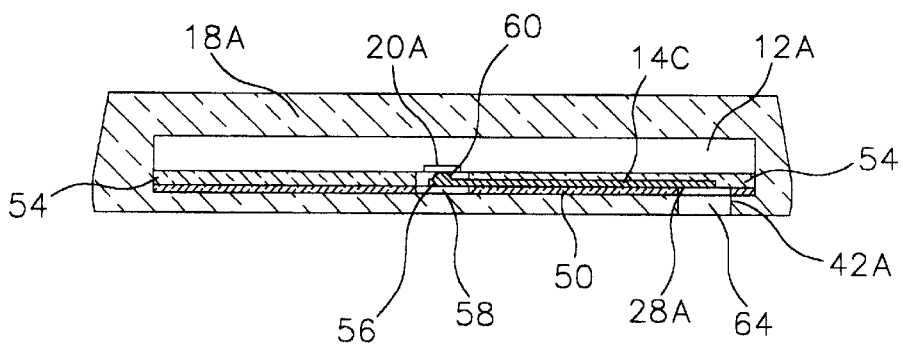

Next, as shown in FIG. 5D, the encapsulating resin 18A is formed on the die 12A and polymer substrate 50. The encapsulating resin 18A includes the opening 42A that aligns with the ball bonding pad 28A on the conductor 14C. The encapsulating resin 18A can comprise a Novoloc resin formed using a transfer molding process.

Figure 5E:
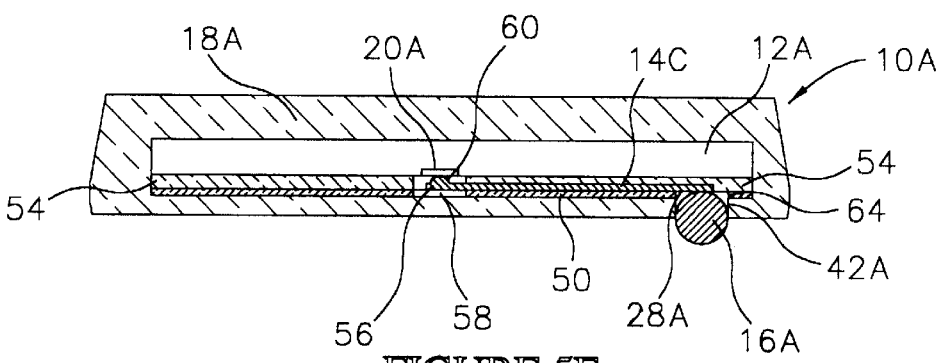

Next, as shown in FIG. 5E, the ball contact 16A is attached to the ball bonding pad 28A. The ball contact 16A can be attached to the ball bonding pad 28A using a solder reflow process substantially as previously described.

Thus the invention provides an improved BGA package and method of fabrication. Although the invention has been described with reference to certain preferred embodiments, as will be apparent to those skilled in the art, certain changes and modifications can be made without departing from the scope of the invention, as defined by the following claims.

I claim:

1. A semiconductor package comprising:
   a semiconductor die;
   a plurality of conductors attached to the die having first sides and opposing second sides, the conductors comprising lead fingers of a metal lead frame, each conductor having a first width W1, the first sides including a plurality of first pads wire bonded to the die, the second sides including a plurality of second pads, each second pad having a second width W2, the first width W1 being less than the second width W2 and the second pads configured in a dense array of rows and columns;
   a polymer tape having configured to attach the die to the conductors, to support the die on the conductors for wire bonding and to electrically insulate the conductors;
   an encapsulating resin encapsulating the die and the conductors and having a plurality of openings therein aligned with the second pads; and
   a plurality of ball contacts in the openings attached to the second pads.

2. The package of claim 1 wherein the conductors include a plurality of first conductors having a substantially linear configuration, and a plurality of second conductors having first portions substantially parallel to the first conductors, and second portions located at substantially right angles to the first conductors.

3. The package of claim 1 wherein at least some of the first pads are arranged along a common axis.

4. The package of claim 1 wherein the polymer tape includes an adhesive on opposing sides thereof.

5. The package of claim 1 wherein the polymer tape comprises polyimide.

6. A semiconductor package comprising:
   a semiconductor die comprising a back, a face and a plurality of bond pads on the face;
   a portion of a metal lead frame comprising a plurality of conductors comprising a plurality of first pads on first sides thereof each having a first width W1, and a plurality of second pads on second sides thereof each having a second width W2, the first width W1 less than the second width W2, and the second pads arranged in a dense grid array of rows and columns;
   a plurality of wires wire bonded to the bond pads and to the first pads;
   a polymer tape adhesively bonded to the back of the die and to the first sides of the conductors and configured to support the die on the conductors for wire bonding the wires to the bond pads and to the first pads;
   an encapsulating resin encapsulating the die and the conductors and having a plurality of openings aligned with the second pads; and
   a plurality of ball contacts in the openings attached to the second pads.

7. The package of claim 6 wherein at least some of the first pads are located along a common axis.

8. The package of claim 6 wherein at least some of the bond pads are arranged proximate to an edge of the die.

9. The package of claim 6 wherein the polymer tape has an outline that is at least as large as that of the die.

10. A semiconductor package comprising:
    a semiconductor die;
    a plurality of conductors attached to the die comprising lead fingers of a metal lead frame, and having first sides and opposing second sides;
    a plurality of first pads on the first sides configured for wire bonding to the die, and a plurality of second pads on the second sides configured in a dense grid array;
    a plurality of wires bonded to the die and to the first pads;
    a polymer tape on the conductors attaching the die to the conductors and configured to support the die for wire bonding the wires to the die and to the first pads;
    an encapsulating resin encapsulating the die and the conductors, and having a plurality of openings therein aligned with the second pads; and
    a plurality of ball contacts in the openings bonded to the second pads.

11. The package of claim 10 wherein the polymer tape comprises polyimide.

12. The package of claim 10 wherein the die comprises a plurality of bond pads proximate to opposing edges thereof wire bonded to the first pads.

13. The package of claim 10 wherein the conductors each have a first width W1 and the second pads each have a width W2 that is greater than W1.

14. The package of claim 10 wherein the lead frame has a leads under chip configuration.

15. A semiconductor package comprising:

a semiconductor die having a face and a back;

a plurality of conductors attached to the back of the die comprising lead fingers of a lead under chip lead frame;

a plurality of first pads on first sides of the conductors and a plurality of second pads on opposing second sides of the conductors arranged in a dense grid array;

a plurality of wires bonded to the die and to the first pads;

a polymer tape on the conductors adhesively bonded to the first sides and to the back of the die and configured to support the die for wire bonding the wires to the die and the first pads;

an encapsulating resin encapsulating the die and the conductors and having a plurality of openings therein aligned with the second pads; and a plurality of contacts in the openings bonded to the second pads.

16. The package of claim 15 wherein the die includes a plurality of bond pads on the face wire bonded to the wires.

17. The package of claim 15 wherein the contacts comprise solder bumps or solder balls.

18. The package of claim 15 wherein the polymer tape comprises polyimide.

19. The package of claim 15 wherein the polymer tape comprises polyimide having adhesive layers on opposing sides thereof.

20. The package of claim 15 wherein the first pads and the second pads comprise plated portions of the lead fingers.

* * * * *

UNITED STATES PATENT AND TRADEMARK OFFICE
CERTIFICATE OF CORRECTION

PATENT NO. : 6,310,390 B1　　　　　　　　　　　　　　　　　　　　　　Page 1 of 1
DATED : October 30, 2001
INVENTOR(S) : Walter Moden It is certified that error appears in the above-identified patent and that said Letters Patent is hereby corrected as shown below:

<u>Column 7,</u>
Line 64, delete "having".

Signed and Sealed this

Twenty-first Day of May, 2002

Attest:

Attesting Officer

JAMES E. ROGAN
*Director of the United States Patent and Trademark Office*